United States Patent
Ogasawara et al.

(10) Patent No.: US 9,153,757 B2
(45) Date of Patent: Oct. 6, 2015

(54) THERMOPLASTIC RESIN COMPOSITION FOR REFLECTIVE MATERIAL, REFLECTIVE PLATE, AND LIGHT-EMITTING DIODE ELEMENT

(75) Inventors: Hideto Ogasawara, Sodegaura (JP); Takashi Hama, Chiba (JP); Kuniaki Kawabe, Ichihara (JP); Hirotaka Kanaya, Chiba (JP); Nobuhiro Takizawa, Kamakura (JP); Akinori Amano, Ichihara (JP); Hiroki Ebata, Yokohama (JP); Kan Komiya, Singapore (SG)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 14/236,450

(22) PCT Filed: Jul. 31, 2012

(86) PCT No.: PCT/JP2012/004872
§ 371 (c)(1),
(2), (4) Date: Jan. 31, 2014

(87) PCT Pub. No.: WO2013/018360
PCT Pub. Date: Feb. 7, 2013

(65) Prior Publication Data
US 2014/0167091 A1    Jun. 19, 2014

(30) Foreign Application Priority Data

Aug. 1, 2011 (JP) ................ 2011-168455
Apr. 6, 2012 (JP) ................ 2012-087983

(51) Int. Cl.
*H01L 33/00* (2010.01)
*H01L 33/60* (2010.01)
(Continued)

(52) U.S. Cl.
CPC ............... *H01L 33/60* (2013.01); *C08L 67/02* (2013.01); *G02B 1/04* (2013.01); *C08K 2003/2241* (2013.01); *C08K 2003/265* (2013.01); *C08L 51/06* (2013.01)

(58) Field of Classification Search
CPC ................................ H01L 33/60; G02B 1/04
USPC ..................... 257/98; 524/427, 513
See application file for complete search history.

(56) References Cited

U.S. PATENT DOCUMENTS 4,659,757 A * 4/1987 Okamoto et al. ............ 523/436
4,686,257 A * 8/1987 Mitsuno et al. ............. 524/449

(Continued)

FOREIGN PATENT DOCUMENTS

JP   57-063310 A   4/1982
JP   58-083006 A   5/1983

(Continued)

OTHER PUBLICATIONS

International Search Report (PCT/ISA/210) mailed on Nov. 6, 2012, by the Japanese Patent Office as the International Searching Authority for International Application No. PCT/JP2012/004872.

(Continued)

*Primary Examiner* — Caleb Henry
(74) *Attorney, Agent, or Firm* — Buchanan, Ingersoll & Rooney PC (57) ABSTRACT

The purpose of the present invention is to provide a thermoplastic resin composition for a reflective material which has excellent mechanical strength, excellent heat resistance, excellent high reflectance, and excellent moldability, and which makes it possible to obtain a reflective plate with little decline in reflectance caused by heating. A first embodiment of this thermoplastic resin composition for a reflective material includes: a polyester resin (A) that has a melting point or glass transition temperature of 250° C. or higher and includes an alicyclic hydrocarbon structure; a thermoplastic resin (B) that has a polyolefin backbone and a functional group; a white pigment (C); and an inorganic filler (D); the thermoplastic resin (B) either including 0.1 to 1.8 wt % of a functional group unit (B1) that further includes a heteroatom, or further including an aromatic hydrocarbon structure (B2), and the limiting viscosity [η] being 0.04 to 1.0 dl/g.

16 Claims, 1 Drawing Sheet

(51) Int. Cl.
    *C08L 67/02*     (2006.01)
    *G02B 1/04*     (2006.01)
    *C08L 51/06*     (2006.01)
    *C08K 3/22*     (2006.01)
    *C08K 3/26*     (2006.01)

(56) References Cited

U.S. PATENT DOCUMENTS

| | | | |
|---|---|---|---|
| 4,892,851 A | 1/1990 | Ewen et al. | |
| 4,952,649 A | 8/1990 | Kioka et al. | |
| 4,971,937 A | 11/1990 | Albizzati et al. | |
| 5,036,034 A | 7/1991 | Ewen | |
| 5,059,638 A * | 10/1991 | Wissmann | 523/205 |
| 5,185,188 A | 2/1993 | Abe et al. | |
| 5,274,023 A * | 12/1993 | Takahashi et al. | 524/425 |
| 5,334,677 A | 8/1994 | Ewen et al. | |
| 5,539,067 A | 7/1996 | Parodi et al. | |
| 5,618,771 A | 4/1997 | Parodi et al. | |
| 6,174,943 B1 * | 1/2001 | Matsumoto et al. | 524/115 |
| 6,194,342 B1 | 2/2001 | Parodi et al. | |
| 6,369,175 B1 | 4/2002 | Ewen | |
| 6,515,085 B1 | 2/2003 | Parodi et al. | |
| 7,101,496 B2 * | 9/2006 | Sekiguchi et al. | 252/585 |
| 7,112,625 B2 * | 9/2006 | Nakayama et al. | 524/504 |
| 2004/0209180 A1 * | 10/2004 | Priebe et al. | 430/60 |
| 2005/0131121 A1 | 6/2005 | Tsutsumi et al. | |
| 2007/0066736 A1 | 3/2007 | Tsutsumi et al. | |
| 2007/0213458 A1 | 9/2007 | Topoulos | |
| 2008/0153966 A1 * | 6/2008 | Feinberg | 524/436 |
| 2008/0237617 A1 * | 10/2008 | Itoh et al. | 257/98 |
| 2008/0314284 A1 * | 12/2008 | Li et al. | 106/31.9 |
| 2009/0062034 A1 * | 3/2009 | Ricci et al. | 473/374 |
| 2010/0309571 A1 * | 12/2010 | Watari et al. | 359/883 |
| 2011/0204406 A1 | 8/2011 | Matsumi et al. | |
| 2011/0310622 A1 | 12/2011 | Topoulos | |
| 2011/0315189 A1 * | 12/2011 | Ge et al. | 136/244 |
| 2012/0108729 A1 * | 5/2012 | Lyons et al. | 524/451 |
| 2012/0135243 A1 * | 5/2012 | Onoe et al. | 428/413 |
| 2013/0158184 A1 | 6/2013 | Topoulos | |
| 2014/0087186 A1 * | 3/2014 | Goberti et al. | 428/375 |
| 2014/0274633 A1 * | 9/2014 | Tilton | 493/82 |
| 2014/0350163 A1 * | 11/2014 | Kim et al. | 524/494 |

FOREIGN PATENT DOCUMENTS

| | | |
|---|---|---|
| JP | 2-041303 A | 2/1990 |
| JP | 3-000706 A | 1/1991 |
| JP | 3-193796 A | 8/1991 |
| JP | 3-223340 A | 10/1991 |
| JP | 4-142362 A | 5/1992 |
| JP | 4-218508 A | 8/1992 |
| JP | 7-242810 A | 9/1995 |
| JP | 2003-105022 A | 4/2003 |
| JP | 3476793 B2 | 12/2003 |
| JP | 4117130 B2 | 7/2008 |
| JP | 2008-182172 A | 8/2008 |
| JP | 2009-507990 A | 2/2009 |
| JP | 4245716 B2 | 4/2009 |
| JP | 2010-85585 A | 4/2010 |
| WO | WO 01/27124 A1 | 4/2001 |
| WO | WO 01/053369 A1 | 7/2001 |
| WO | WO 2007/033129 A3 | 3/2007 |
| WO | WO 2010/050576 A1 | 5/2010 |

OTHER PUBLICATIONS

Extended Search Report issued in corresponding European Application No. 12820129 on May 20, 2015 (6 pages).

Office Action issued by the Chinese Patent Office in corresponding Chinese Patent Application No. 2012800384509 on Jul. 13, 2015 (7 pages).

\* cited by examiner

THERMOPLASTIC RESIN COMPOSITION FOR REFLECTIVE MATERIAL, REFLECTIVE PLATE, AND LIGHT-EMITTING DIODE ELEMENT

TECHNICAL FIELD

The present invention relates to a resin composition which is suitable for a reflective material and can be used even at high temperatures, and to a reflective plate obtained by molding the resin composition. More particularly, the present invention relates to a thermoplastic resin composition for a reflective material comprising a polyester resin, a thermoplastic resin having a specific structure, an inorganic filler, and a white pigment, which has excellent in reflectance, heat resistance and mechanical strength, and is suitable for insert molding. And also, the present invention relates to a reflective plate obtained by molding the resin composition.

BACKGROUND ART

A reflective plate is used in various situations in order to utilize light efficiently. Recently, a light source has been changed to a semiconductor-based one, that is a semiconductor laser, a light-emitting diode (hereinafter referred to as LED) or the like, because of downsizing an apparatus and a light source. Therefore, the reflective plate is surface-mounted on a printed-circuit board or the like, and required to have not only mechanical strength, but also good heat resistance and precision moldability. The reflective plate is also required to have stable high reflectance for a long time and in particular, to suppress decreasing the reflectance of a reflective material due to heating in the steps of assembling LED and reflow soldering.

Furthermore, a cost reduction of products using a reflective plate has been remarkably required, recently. And also it is required: to decrease the number of LED packages mounted on an end product such as TV, a monitor and so on to increase the luminance of an LED element; to downsize a product; to increase the number of the LED packages by injection molding; and the like. Therefore, a reflective material preferably has high molding processability and is particularly required to have high melt-flowability. In addition, a reflective material is being required to improve the strength and the toughness hand in hand with the downsizing of a product.

Glass fibers are generally used in wide applications as a reinforcing material of a reflective plate. However, the melt-flowability of a reflective material would be low for a large number of molded articles by one shot, and the molded articles would have a gate-cut surface with roughness, and particularly in a small-sized product, the gate-cut surface with roughness tends to significantly affect a product appearance.

Various improvements have been attempted in order to solve this problem. There are inorganic reinforcing materials, for example Wollastonite (PTL 1), potassium titanate (PTL 2), and a combination of potassium titanate and titanium oxide (PTL 3).

However, by blending a multiple kinds of the reinforcing materials, there is concern about decreasing the reflectance and the mechanical strength because of a poor dispersion of the reinforcing materials in a base polymer. Furthermore, a special screw configuration, temperature setting, and the like would be required for good dispersion of reinforcing materials in a base polymer in the melt mixing. There is a possibility of decreasing properties due to the decomposition thereof by increasing a load to base polymers, and a cost would increase.

On the other hand, a technique of suppressing decreasing the reflectance of a reflective plate by improving a base polymer is also shown (PTL 4). In many examples, a polyamide material is used for a reflective plate, however discoloration derived from a terminal amino group or an amide bond would occur, resulting in decreasing the reflectance. Therefore, a heat-resistant polyester is attempted to be used instead of a polyamide resin. However, there are no reports how the mechanical strength and the flowability would be changed by alternating a polyamide and a heat-resistant polyester, and the performance balance of a reflective material is unknown.

Further, PTL 4 discloses a method in which a composition containing a heat-resistant polyester and a polymer containing a glycidyl methacrylate group is used for increasing strength and toughness.

CITATION LIST

Patent Literature

PTL 1: Japanese Patent No. 4245716
PTL 2: Japanese Patent No. 4117130
PTL 3: Japanese Patent Application Laid-Open No. 2008-182172
PTL 4: Japanese Translation of a PCT Application Laid-Open No. 2009-507990

SUMMARY OF INVENTION

Technical Problem

According to the studies of the present inventors, it has been found that the composition containing a heat-resistant polyester and a polymer containing a glycidyl methacrylate group is excellent in mechanical strength balance such as toughness, however further improvement is necessary in terms of temporal stability of reflectance or in terms of melt-flowability of a resin composition.

Accordingly, an object of the present invention is to provide a thermoplastic resin composition for a reflective material which is excellent in mechanical strength typified particularly by toughness, heat resistance, reflectance and moldability. And also, an object of the present invention is to provide the thermoplastic resin composition which can provide a reflective plate showing little decrease in reflectance due to heating in the steps of producing LED, reflow soldering, and the like. And further an object of the present invention is to provide a reflective plate containing the resin composition.

Further, according to the results of studies by the present inventors, it has been found that while a polyester resin containing an alicyclic hydrocarbon structure is excellent in heat resistance and stability for a long time, however an improvement in melt-flowability is necessary from a practical point of view.

Accordingly, an object of the present invention is to provide a thermoplastic resin composition for a reflective material which has high mechanical strength of a molded article, is excellent in heat resistance, can stably provide high reflectance, is excellent in moldability, and shows little decrease in reflectance due to heating in the steps of producing LED and reflow soldering. And further, an object of the present invention is to provide a reflective plate obtained by molding the resin composition.

Solution to Problem

As a result of intensive studies in view of such circumstances, the present inventors have found that a resin composition including a specific thermoplastic resin containing an aromatic structure and a hetero atom has good performance. More specifically, the present inventors have found that a composition has high revel heat resistance, high revel toughness, high revel moldability and high revel temporal stability of reflectance, the composition including: an olefin polymer (thermoplastic resin B1) having a specific structure containing a hetero atom which is one of the specific thermoplastic resin; a thermoplastic resin having high melting point or glass transition temperature; and a white pigment. As a result, the present invention has been completed.

The present inventors have also found that a resin composition is not only excellent in flowability, but has a higher reflectance value than before, the resin composition including: in a specific ratio, a thermoplastic resin (thermoplastic resin B2) having a polyolefin skeleton and an aromatic hydrocarbon structure which is one of the specific thermoplastic resin; and a polyester resin containing an alicyclic hydrocarbon structure. The resin composition can solve the above problems, and the present invention has been completed.

[1] A thermoplastic resin composition for a reflective material including 30 to 85% by mass of a polyester resin (A) having a melting point or glass transition temperature of 250° C. or more, 0.1 to 15% by mass of a thermoplastic resin (B) having a polyolefin skeleton and a functional group structure, 5 to 50% by mass of a white pigment (C), and 1 to 50% by mass of an inorganic filler OA in which the total of (A), (B), (C) and (D) is 100% by mass, the thermoplastic resin (B) being a thermoplastic resin (B1) containing a polyolefin skeleton and 0.1 to 1.8% by weight of a functional group structure containing a hetero atom, or a thermoplastic resin (B2) containing a polyolefin skeleton and an aromatic hydrocarbon structure and having an intrinsic viscosity [η] as measured at 135° C. in decalin of 0.04 to 1.0 dl/g.

[2] The thermoplastic resin composition for a reflective material as mentioned in [1], in which the polyester resin (A) contains an alicyclic hydrocarbon structure, and a content of the inorganic filler (D) is 10 to 50% by mass.

[3] The thermoplastic resin composition for a reflective material as mentioned in [1], in which a content of the polyester resin (A) is 30 to 80% by mass.

[4] The thermoplastic resin composition for a reflective material as mentioned in any one of [1] to [3], in which the thermoplastic resin (B) is the thermoplastic resin (B1), and the polyester resin (A) is a polyester resin (A1) containing a dicarboxylic acid component unit (a-1) including 30 to 100 mol % of a dicarboxylic acid component unit derived from terephthalic acid, 0 to 70 mol % of an aromatic dicarboxylic acid component unit other than terephthalic acid, and/or 0 to 70 mol % of a $C_{4-20}$ aliphatic dicarboxylic acid component unit, and a $C_{4-20}$ alicyclic dialcohol component unit (a-2) and/or a $C_{4-20}$ aliphatic dialcohol component unit (a-3).

[5] The thermoplastic resin composition for a reflective material as mentioned in [4], in which the alicyclic dialcohol component unit (a-2) contained in the polyester resin (A1) has a cyclohexane skeleton.

[6] The thermoplastic resin composition for a reflective material as mentioned in [4] or [5], in which the inorganic filler (D) includes an inorganic filler containing a carbonyl structure and having an aspect ratio of 1 to 300.

[7] The thermoplastic resin composition for a reflective material as mentioned in any one of [4] to [6], in which the inorganic filler (D) includes two or more inorganic fillers having different average lengths and aspect ratios.

[8] The thermoplastic resin composition for a reflective material as mentioned in any one of [4] to [7], in which the inorganic filler (D) is a calcium carbonate whisker.

[9] The thermoplastic resin composition for a reflective material as mentioned in any one of [4] to [8], in which the thermoplastic resin (B1) contains a functional group selected from carboxylic acid, ester, ether, aldehyde, and ketone.

[10] The thermoplastic resin composition for a reflective material as mentioned in any one of [4] to [9], in which the thermoplastic resin (B1) contains a maleic acid anhydride structural unit.

[11] The thermoplastic resin composition for a reflective material as mentioned in any one of [1] to [3], in which the thermoplastic resin (B) is the thermoplastic resin (B2), and the polyester resin (A) is a polyester resin (A2) containing a dicarboxylic acid component unit (a-1) including 30 to 100 mol % of a dicarboxylic acid component unit derived from terephthalic acid, 0 to 70 mol % of an aromatic dicarboxylic acid component unit other than terephthalic acid, and/or 0 to 70 mol % of a $C_{4-20}$ aliphatic dicarboxylic acid component unit, and a $C_{4-20}$ alicyclic dialcohol component unit (a-2).

[12] The thermoplastic resin composition for a reflective material as mentioned in [11], in which the alicyclic dialcohol component unit (a-2) contained in the polyester resin (A2) has a cyclohexane skeleton.

[13] The thermoplastic resin composition for a reflective material as mentioned in [11] or [12], in which the white pigment (C) is titanium oxide.

[14] A reflective plate containing the thermoplastic resin composition for a reflective material as mentioned in any one of [1] to [3].

[15] The reflective plate according to [14], in which the reflective plate is for a light-emitting diode element.

[16] A light-emitting diode element containing the thermoplastic resin composition for a reflective material as mentioned in any one of [1] to [3].

Advantageous Effects of Invention

The present invention can provide a resin composition for a reflective material which has high mechanical strength of a molded article typified particularly by toughness, is excellent in heat resistance, is excellent in flowability and moldability, shows little temporal decrease in reflectance, and shows little decrease in reflectance due to heating particularly in the steps of producing LED and reflow soldering. And the resin composition can provide a reflective plate obtained by molding the resin composition. Therefore, the industrial value of the present invention is extremely high.

Further, the present invention can provide a resin composition for a reflective material which has high mechanical strength as a molded article, is excellent in heat resistance, is excellent in flowability and moldability, has high reflectance, and shows little temporal decrease in reflectance. And also, the resin composition can provide a reflective plate obtained by molding the resin composition. In particular, since the resin composition for a reflective material of the present invention has high initial reflectance and shows little reduction in reflectance due to heating in the steps of producing LED and reflow soldering, its industrial value is extremely high.

DESCRIPTION OF EMBODIMENTS

1. Thermoplastic Resin Composition for Reflective Material

The thermoplastic resin composition for a reflective material of the present invention includes a polyester resin (A), a specific thermoplastic resin (B), a white pigment (C) and an inorganic filler (D), and may further include other additives and the like if needed. The thermoplastic resin composition for a reflective material of the present invention may be a thermoplastic resin composition for a reflective material of Embodiment 1 or 2 to be described below.

[Polyester Resin (A)]

The polyester resin (A) to be suitably used in the present invention preferably contains at least a component unit derived from an aromatic dicarboxylic acid and a component unit derived from a dialcohol having a cyclic skeleton.

Examples of the component unit derived from a dialcohol having a cyclic skeleton include a component unit derived from an alicyclic dialcohol and a component unit derived from an aromatic dialcohol, but a component unit derived from an alicyclic dialcohol is preferred from the point of view of heat resistance and moldability.

Such a polyester resin (A) is preferably a polyester resin (A1) containing a specific dicarboxylic acid component unit (a-1), and an alicyclic dialcohol component unit (a-2) and/or an aliphatic dialcohol component unit (a-3); or a polyester resin (A2) containing a specific dicarboxylic acid component unit (a-1) and an alicyclic dialcohol component unit (a-2).

The dicarboxylic acid component unit (a-1) in the polyester resin (A1) or (A2) preferably includes 30 to 100 mol % of a terephthalic acid component unit, 0 to 70 mol % of an aromatic dicarboxylic acid component unit other than terephthalic acid, and/or 0 to 70 mol % of a $C_{4-20}$ aliphatic dicarboxylic acid component unit, and the total amount of these dicarboxylic acid component units (a-1) is 100 mol %.

The aromatic dicarboxylic acid component unit other than terephthalic acid is preferably a component unit derived, for example, from isophthalic acid, 2-methylterephthalic acid, naphthalene dicarboxylic acid, and a combination thereof.

The number of carbon atoms of the aliphatic dicarboxylic acid component unit is not particularly limited, but this unit may be derived from a $C_{4-20}$ aliphatic dicarboxylic acid, preferably a $C_{6-12}$ aliphatic dicarboxylic acid. Examples of the aliphatic dicarboxylic acid to be used for deriving the aliphatic dicarboxylic acid component unit include adipic acid, suberic acid, azelaic acid, sebacic acid, decane dicarboxylic acid, undecane dicarboxylic acid, and dodecane dicarboxylic acid, and the aliphatic dicarboxylic acid may preferably be adipic acid.

Further, in the present invention, the dicarboxylic acid component unit (a-1) may include preferably 40 to 100 mol %, more preferably 40 to 80 mol % of a terephthalic acid component unit; preferably 0 to 60 mol %, more preferably 20 to 60 mol % of an aromatic dicarboxylic acid component unit other than terephthalic acid; and/or preferably 0 to 60 mol %, more preferably 20 to 60 mol % of a $C_{4-20}$ aliphatic dicarboxylic acid component unit, preferably a $C_{6-12}$ aliphatic dicarboxylic acid component unit.

Further, in the present invention, the dicarboxylic acid component unit (a-1) may further include a small amount, for example, about 10 mol % or less, of a polyvalent carboxylic acid component unit in addition to the constitutional units as described above. Specific examples of such a polyvalent carboxylic acid component unit include a tribasic acid and a polybasic acid, such as trimellitic acid and pyromellitic acid.

Further, the polyester resin (A1) or (A2) can also contain a component unit derived from an alicyclic dicarboxylic acid such as cyclohexanedicarboxylic acid in addition to the component units as described above.

The alicyclic dialcohol component unit (a-2) in the polyester resin (A1) or (A2) preferably include a component unit derived from a dialcohol having a $C_{4-20}$ alicyclic hydrocarbon skeleton. Examples of the dialcohol having an alicyclic hydrocarbon skeleton which can be used include an alicyclic dialcohol such as 1,3-cyclopentanediol, 1,3-cyclopentanedimethanol, 1,4-cyclohexanediol, 1,4-cyclohexanedimethanol, 1,4-cycloheptanediol, and 1,4-cycloheptanedimethanol. From the point of view of heat resistance, water absorption properties, availability, and the like, the component unit derived from a dialcohol having a cyclohexane skeleton is preferred among others, and the component unit derived from cyclohexanedimethanol is more preferred.

The alicyclic dialcohol includes isomers having a cis-configuration, a trans-configuration and the like, and the trans configuration is preferred from the point of view of heat resistance. Therefore, the cis/trans ratio is preferably from 50/50 to 0/100, more preferably from 40/60 to 0/100.

The polyester resin (A1) or (A2) may further contain an aromatic dialcohol component unit (a-3) other than the alicyclic dialcohol component unit (a-2) if needed. Examples of the aromatic dialcohol include aromatic diols such as bisphenol, hydroquinone, and 2,2-bis(4-β-hydroxyethoxy phenyl) propane.

Further, the polyester resin (A1) or (A2) may further contain an aliphatic dialcohol component unit (a-4) other than the above alicyclic dialcohol component unit (a-2) for the purpose of increasing the melt-flowability of the resin and the like. Specific examples of the aliphatic dialcohol include ethylene glycol, trimethylene glycol, propylene glycol, tetramethylene glycol, neopentyl glycol, hexamethylene glycol, and dodecamethylene glycol.

The melting point (Tm) or glass transition temperature (Tg) measured with a differential scanning calorimeter (DSC) of the polyester resin (A) used in the present invention is 250° C. or more. The lower limit is preferably 270° C., more preferably 290° C. On the other hand, the upper limit is preferably 350° C., more preferably 335° C. When the melting point or glass transition temperature is 250° C. or more, the deformation of the reflective plate during reflow soldering is suppressed. Although the upper limit temperature is not limited in principle, a melting point or glass transition temperature of 350° C. or less is preferred because it can suppress the decomposition of a polyester resin during melt molding.

For example, the melting point (Tm) or glass transition temperature (Tg) of the polyester resin (A) may be in the range of 270° C. to 350° C., preferably in the range of 290 to 335° C.

The intrinsic viscosity [η] of the polyester resin (A) is preferably from 0.3 to 1.0 dl/g. When the intrinsic viscosity is in such a range, the flowability during the molding of the thermoplastic resin composition may be excellent. The intrinsic viscosity of the polyester resin (A) can be adjusted by, for example, adjusting the molecular weight of the polyester resin (A). A known method, such as adjusting the degree of completion of a polycondensation reaction or adding a suitable amount of a monofunctional carboxylic acid, a monofunctional alcohol, or the like, can be employed as a method for adjusting the molecular weight of the polyester resin.

The intrinsic viscosity is a value calculated from the following expression, wherein the polyester resin (A) is dissolved in a mixed solvent of phenol and tetrachloroethane in a mass ratio of 50/50, and the falling time (seconds) of the sample solution is measured using an Ubbelohde viscometer under a condition of 25° C.±0.05° C.

$[\eta]=\eta SP/[C(1+0.205\eta SP)]$

[η]: intrinsic viscosity (dl/g)
ηSP: specific viscosity
C: sample concentration (g/dl)
t: falling time (seconds) of sample solution
t0: falling time (seconds) of a solvent
ηSP=(t−t0)/t0

[Method for the Preparation of Polyester Resin (A)]

The polyester resin (A) can be obtained, for example, by blending a molecular weight modifier or the like in the reaction system containing a dicarboxylic acid component unit (a-1) and an alicyclic dialcohol component unit (a-2), and by allowing at least the dicarboxylic acid component unit (a-1) and the alicyclic dialcohol component unit (a-2) to react with each other. As described above, the intrinsic viscosity of the polyester resin (A) can be adjusted by blending a molecular weight modifier in the reaction system.

A monocarboxylic acid and a monoalcohol can be used as a molecular weight modifier. Examples of the monocarboxylic acid include a $C_{2-30}$ aliphatic monocarboxylic acid, an aromatic monocarboxylic acid, and an alicyclic monocarboxylic acid. Note that the aromatic monocarboxylic acid and alicyclic monocarboxylic acid may have a substituent in the cyclic structure part. Examples of the aliphatic monocarboxylic acid include acetic acid, propionic acid, butyric acid, valeric acid, caproic acid, caprylic acid, lauric acid, tridecyl acid, myristic acid, palmitic acid, stearic acid, oleic acid, and linoleic acid. Further, examples of the aromatic monocarboxylic acid include benzoic acid, toluic acid, naphthalene carboxylic acid, methylnaphthalene carboxylic acid, and phenylacetic acid, and examples of the alicyclic monocarboxylic acid include cyclohexane carboxylic acid.

Such a molecular weight modifier is used in an amount of generally 0 to 0.07 mol, preferably 0 to 0.05 mol relative to 1 mol of the total amount of the dicarboxylic acid component unit (a-1) in the reaction system, for the reaction of the dicarboxylic acid component unit (a-1) and the alicyclic dialcohol component unit (a-2) as described above.

Further, in the present invention, a plurality of polyester resins (A) having different physical properties may be used in combination, if needed. Furthermore, other thermoplastic resins may be used in combination as long as they are within the range of the objects of the present invention.

Thermoplastic Resin (B)

The thermoplastic resin (B) is a thermoplastic resin having a polyolefin skeleton and a functional group structure. Examples of the functional group structure include a functional group structure containing a hetero atom (for example, a group having an ester, a carboxylic acid, an ether, an aldehyde, a ketone or the like) and an aromatic hydrocarbon structure.

Such a thermoplastic resin (B) is preferably a thermoplastic resin (B1) having a polyolefin skeleton and a functional group structure containing a hetero atom; or a thermoplastic resin (B2) having a polyolefin skeleton and an aromatic hydrocarbon structure.

That is, the thermoplastic resin composition for a reflective material of Embodiment 1 of the present invention may contain a thermoplastic resin (B1) containing a polyolefin skeleton and a functional group structure containing a hetero atom, as the thermoplastic resin (B).

About Thermoplastic Resin (B1)

The thermoplastic resin (B1) is an olefin polymer and contains 0.1 to 1.8% by mass of a functional group structure (structural unit) relative to 100% by mass of the olefin polymer. The functional group structure is preferably a functional group structure containing a hetero atom. More specifically, a functional group structure containing carbon, hydrogen, and/or oxygen is a preferred embodiment, and specific examples include an ester group, an ether group, a carboxylic acid group (including a carboxylic acid anhydride group), an aldehyde group, and a ketone group.

Preferred examples of the olefin polymer skeletal part of the thermoplastic resin (B1) include a known polymer skeleton such as an ethylene-based polymer, a propylene-based polymer, and a butene-based polymer and a copolymer of these olefins. A particularly preferred olefin polymer skeleton is a copolymer of ethylene and a $C_{>3}$ olefin.

The thermoplastic resin (B1) can be obtained, for example, by allowing a corresponding known olefin polymer and a corresponding compound having a functional group structure to react with each other at a specific ratio. One of the preferred examples of the olefin polymer is an ethylene-α-olefin copolymer. Hereinafter, the case where an ethylene-α-olefin copolymer is used as the olefin polymer will be described.

The ethylene-α-olefin copolymer is a copolymer of ethylene with other olefins, for example, a $C_{3-10}$ α-olefin such as propylene, 1-butene, 1-hexene, 4-methyl-1-pentene, 1-octene, and 1-decene. Specific examples of the ethylene-α-olefin copolymer before being modified include an ethylene-propylene copolymer, an ethylene-1-butene copolymer, an ethylene-1-hexene copolymer, an ethylene-1-octene copolymer, and an ethylene-4-methyl-1-pentene copolymer. Among these, an ethylene-propylene copolymer, an ethylene-1-butene copolymer, an ethylene-1-hexene copolymer, and an ethylene-1-octene copolymer are preferred.

In the ethylene-α-olefin copolymer in the present invention, desirably, a structural unit derived from ethylene accounts for 70 to 99.5 mol %, preferably 80 to 99 mol %, and a structural unit derived from α-olefin accounts for 0.5 to 30 mol %, preferably 1 to 20 mol %.

The ethylene-α-olefin copolymer in the present invention desirably has a melt flow rate (MFR) at 190° C. and a load of 2.16 kg according to ASTM D1238 of 0.01 to 20 g/10 minutes, preferably 0.05 to 20 g/10 minutes.

The method for producing the ethylene-α-olefin copolymer in the present invention is not particularly limited and, for example, the ethylene-α-olefin copolymer can be prepared by a known method in which a transition metal catalyst based on titanium (Ti), vanadium (V), chromium (Cr), zirconium (Zr), or the like is used. More specific examples include a method for producing the copolymer by copolymerizing ethylene and one or more $C_{3-10}$ α-olefins in the presence of a Ziegler type catalyst comprising a vanadium-based compound and an organoaluminum compound, or a metallocene catalyst. A production method in which a metallocene catalyst is used is particularly suitable.

Particularly preferred examples of the above functional group-containing compound are unsaturated carboxylic acids or derivatives thereof, and specific examples include unsaturated carboxylic acids such as acrylic acid, methacrylic acid, α-ethylacrylic acid, maleic acid, fumaric acid, itaconic acid, citraconic acid, tetrahydrophthalic acid, methyl tetrahydrophthalic acid, and endo-cis-bicyclo[2,2,1]hept-5-ene-2,3-dicarboxylic acid (Nadic acid [trade name]), and derivatives thereof such as acid halides, amides, imides, acid anhydrides, and esters. Among these, unsaturated dicarboxylic acids or acid anhydrides thereof are suitable, and maleic acid, Nadic acid (trade name), or acid anhydrides thereof are particularly suitable.

Particularly preferred functional group-containing compounds include maleic acid anhydride. Maleic acid anhydride has relatively high reactivity with the olefin polymers as described above, shows a little structural change in itself due to polymerization or the like, and tends to have a stable basic structure. Therefore, it has various advantages such as capable of obtaining a thermoplastic resin (B1) with stable quality.

In order to obtain a thermoplastic resin (B1) using the ethylene-α-olefin copolymer as described above, one example is a method for obtaining the thermoplastic resin (B1) by subjecting the ethylene-α-olefin copolymer to so-called graft modification with a functional group-containing compound corresponding to a functional group structural unit.

The graft modification of the ethylene-α-olefin copolymer can be carried out by a known method. Examples of the graft modification include a method in which the ethylene-α-olefin copolymer is dissolved in an organic solvent, and then to the resulting solution is added with an unsaturated carboxylic acid or a derivative thereof, a radical initiator, and the like, and the resulting mixture is allowed to react at a temperature of generally 60 to 350° C., preferably 80 to 190° C., for 0.5 to 15 hours, preferably 1 to 10 hours.

As the above organic solvent, any organic solvent can be used without any particular limitation as long as the organic solvent can dissolve an ethylene-α-olefin copolymer. Examples of such the organic solvent include aromatic hydrocarbon solvent such as benzene, toluene and xylene; and aliphatic hydrocarbon solvent such as pentane, hexane and heptane.

Examples of another graft modification method include a method in which an ethylene-α-olefin copolymer is allowed to react with an unsaturated carboxylic acid or a derivative thereof using an extruder or the like, preferably without using a solvent in combination. With respect to the reaction conditions in this case, the reaction temperature may generally be the melting point of the ethylene-α-olefin copolymer or higher, specifically 100 to 350° C. The reaction time may generally be 0.5 to 10 minutes.

In order to efficiently subject the functional group-containing compound such as an unsaturated carboxylic acid to graft copolymerization, the reaction is preferably carried out in the presence of a radical initiator.

Examples of the radical initiator to be used include an organic peroxide and an organic perester, such as benzoyl peroxide, dichlorobenzoyl peroxide, dicumyl peroxide, di-t-butyl peroxide, 2,5-dimethyl-2,5-di(peroxide benzoate)hexyne-3,1,4-bis(t-butylperoxyisopropyl)benzene, lauroyl peroxide, t-butyl peracetate, 2,5-dimethyl-2,5-di(t-butylperoxy)hexyne-3, 2,5-dimethyl-2,5-di(t-butylperoxy)hexane, t-butyl perbenzoate, t-butyl perphenylacetate, t-butyl perisobutyrate, t-butyl per-sec-octoate, t-butyl perpivalate, cumyl perpivalate, and t-butyl perdiethylacetate; and an azo compound such as azobisisobutyronitrile and dimethyl azoisobutyrate. Among these, dialkyl peroxides, such as dicumyl peroxide, di-t-butyl peroxide, 2,5-dimethyl-2,5-di(t-butylperoxy)hexyne-3,2,5-dimethyl-2,5-di(t-butylperoxy)hexane, and 1,4-bis(t-butylperoxyisopropyl)benzene, are preferred. A radical initiator is generally used in a proportion of 0.001 to 1 part by weight relative to 100 parts by weight of the ethylene-α-olefin copolymer before being modified.

The modified ethylene-α-olefin copolymer which is one of the preferred embodiments of the thermoplastic resin (B1) used in the present invention has a density of preferably from 0.80 to 0.95 g/cm³, more preferably from 0.85 to 0.90 g/cm³.

Further, the content of the functional group structure in the modified ethylene-α-olefin copolymer is generally from 0.1 to 1.8% by weight, preferably from 0.2 to 1.5% by weight.

Further, the intrinsic viscosity [η] of the modified ethylene-α-olefin copolymer as measured in a decalin (decahydronaphthalene) solution at 135° C. is preferably from 1.5 to 4.5 dl/g, more preferably from 1.6 to 3 dl/g. When [η] is within the above range, the resin composition of the present invention can achieve both toughness and melt-flowability at a high level.

Note that [η] of the thermoplastic resin (B1) in decalin at 135° C. is measured based on a conventional method as follows.

In 15 ml of decalin, is dissolved 20 mg of a sample, and the decalin solution is measured for specific viscosity (ηSP) in a 135° C. atmosphere using an Ubbelohde viscometer. To the decalin solution, is further added 5 ml of decalin, and after the dilution, the same specific viscosity measurement is carried out. This dilution operation and viscosity measurement are further repeated twice, and based on the results of the measurements, the "ηSP/C" value when the concentration (C) is extrapolated to zero is the intrinsic viscosity [η] by definition.

The content of the functional group structural unit contained in the thermoplastic resin (B1) in the present invention is 0.1 to 1.8% by mass, preferably 0.2 to 1.5% by mass, further preferably 0.2 to 1.2% by mass. If the content of the functional group structural unit is too low, the improvement effect of the toughness of the resin composition to be described below may be poor. This is supposed that the interaction between the thermoplastic resin (B1) and the polyester resin (A) is so weak that the thermoplastic resin (B1) is easily aggregated, resulting in difficulty in exhibiting sufficient improvement effect of toughness. On the other hand, if the content of the functional group structural unit is too high, the interaction with the thermoplastic resin (A) may be so strong that melt-flowability may be reduced, resulting in causing reduction in moldability. Further, this excessive functional group may cause coloring due to modification by heat and light or the like, resulting in a decrease in temporal stability of reflectance. In addition, when a large number of functional group structural units are introduced into an olefin polymer, an unreacted functional group-containing compound tends to remain, and such an unreacted compound may accelerate the problems due to modification (coloring or the like).

The content of these functional group structural units can be specified by a known method such as the charging ratio of an olefin polymer and a functional group-containing compound to be reacted in the presence of a radical initiator and the like, $^{13}$C NMR measurement, and $^1$H NMR measurement. The following conditions can be shown as specific NMR measurement conditions.

In the case of the $^1$H NMR measurement, the measurement is carried out by using an ECX400-type nuclear magnetic resonance apparatus manufactured by JEOL Ltd. under the conditions of deuterated orthodichlorobenzene as a solvent, a sample concentration of 20 mg/0.6 mL, a measurement temperature of 120° C., an observation nucleus of $^1$H (400 MHz), a sequence of a single pulse, a pulse width of 5.12 μseconds (45° pulse), a repetition time of 7.0 seconds, and an integration count of 500 times or more. The reference chemical shift can be defined by setting hydrogen of tetramethylsilane at 0 ppm. The same results can be obtained, for example, by setting the peak derived from residual hydrogen of deuterated orthodichlorobenzene at 7.10 ppm as the reference value of the chemical shift. A peak of $^1$H or the like derived from a functional group-containing compound can be assigned by a conventional method.

In the case of the $^{13}C$ NMR measurement, the measurement is carried out using an ECP500-type nuclear magnetic resonance apparatus manufactured by JEOL Ltd. as the measuring apparatus under the conditions of an orthodichlorobenzene/deuterated benzene (80/20 vol. %) mixed solvent as a solvent, a measurement temperature of 120° C., an observation nucleus of $^{13}C$ (125 MHz), single pulse proton decoupling, a 45° pulse, a repetition time of 5.5 seconds, an integration count of 10,000 times or more, and a reference value of the chemical shift of 27.50 ppm. Assignment of various signals can be carried out based on a conventional method, and qualitative analysis can be carried out based on the integrated value of signal strength.

Another simple method for measuring the content of functional group structural units may include a method including determining in advance the functional group content of polymers each having a different functional group content by the above NMR measurement, carrying out infrared spectroscopy (IR) measurement of these polymers, preparing a calibration curve based on the intensity ratio of a specific peak, and determining the functional group content based on this result. This method is simple as compared with the NMR measurement as described above, but it is basically necessary to prepare a respectively corresponding calibration curve depending on the type of a base resin or a functional group. From these reasons, this method is suitably used, for example, for the process control in the resin production in a commercial plant or the like.

The thermoplastic resin (B1) is used in a proportion of 0.1 to 15% by mass, preferably 0.5 to 15% by mass, and more preferably 1 to 12% by mass, when the sum of the components (A) to (D) is set to 100% by mass.

The thermoplastic resin composition for a reflective material of Embodiment 2 of the present invention may contain a thermoplastic resin (B2) containing a polyolefin skeleton and an aromatic hydrocarbon structure as the thermoplastic resin (B). As will be described below, the aromatic hydrocarbon structure may be a structural unit to be derived from a vinyl compound having an aromatic hydrocarbon structure typified by styrene and the like.

Thermoplastic Resin (B2)

The thermoplastic resin (B2) to be used in the present invention is a thermoplastic resin which has a polyolefin skeleton and an aromatic hydrocarbon structure and which has an intrinsic viscosity [η] as measured at 135° C. in decalin of 0.04 to 1.0 dl/g. The lower limit of the intrinsic viscosity is preferably 0.05 dl/g, more preferably 0.07 dl/g. On the other hand, the upper limit is preferably 0.5 dl/g, more preferably 0.2 dl/g. If the intrinsic viscosity is too low, the thermoplastic resin (B2) is liable to bleed out more than needed from the thermoplastic resin composition for a reflective material of the present invention, resulting in possibility of reduction in reflectance. Further, it may easily cause an odor and smoke generation during the mold processing. On the other hand, if the intrinsic viscosity is too high, the insufficient reflectance improvement effect as well as too high melt viscosity is obtained.

The melt viscosity (mPa·s) at 140° C. of the thermoplastic resin (B2) is preferably 10 to 2,000 mPa·s, more preferably 20 to 1,500 mPa·s, and most preferably 30 to 1,200 mPa·s. If the melt viscosity at 140° C. of the thermoplastic resin (B2) is too low, the thermoplastic resin (B2) is liable to bleed out more than needed from the thermoplastic resin composition for a reflective material, resulting in possibility of reduction in reflectance. Further, it may easily cause an odor and smoke generation during the mold processing. On the other hand, if the melt viscosity at 140° C. of the thermoplastic resin (B2) is too high, the insufficient reflectance improvement effect as well as the too high melt viscosity of a resin composition is obtained. The above viscosity can be measured with a Brookfield viscometer.

Representative examples of the thermoplastic resin (B2) include a so-called modified wax generally obtained by allowing a vinyl compound having an aromatic hydrocarbon structure typified by styrenes to react with a wax referred to as polyolefin wax (hereinafter may be referred to as polyolefin wax (b)) in the presence of a radical generator such as nitrile and a peroxide.

In particular, the thermoplastic resin (B2) is desirably the one in which 1 to 900 parts by mass, more preferably 10 to 300 parts by mass, most preferably 20 to 200 parts by mass of a vinyl compound having an aromatic hydrocarbon structure such as styrene is introduced into 100 parts by mass of the above polyolefin wax (b). If the content of the structure derived from aromatic hydrocarbon is too low, the improvement effect of reflectance to be described below may be insufficient. On the other hand, if the content of the structure derived from aromatic hydrocarbon is too high, the odor may be strong.

The content of the aromatic hydrocarbon structure of the thermoplastic resin (B2) can be specified by conventional methods such as: the charging ratio of the polyolefin wax (b) to the vinyl compound having an aromatic hydrocarbon structure during the preparation; and the structure identification by the nuclear magnetic resonance spectroscopy analyzer (NMR) of a 100-600 MHz class such as the ratio of the absorption intensity of a phenyl structure carbon to that of other carbon and the ratio of the absorption intensity of a phenyl structure hydrogen to that of other hydrogen. Alternatively, for the structure identification, it is also possible to use infrared absorption spectrum analysis and the like in combination.

The type of the vinyl compound having an aromatic hydrocarbon structure is not particularly limited, but examples thereof include styrene, α-methylstyrene, o-methylstyrene, m-methylstyrene, and p-methylstyrene. Styrene is preferred among others.

Examples of the polyolefin wax (b) include homopolymers of α-olefins such as ethylene, propylene, 1-butene, 1-hexene, 4-methyl-1-pentene, and 1-decene, and ethylene-based wax, propylene-based wax, and 4-methyl-1-pentene-based wax prepared by copolymerizing two or more α-olefins Among these polyolefin waxes, ethylene-based wax essentially comprising ethylene is suitable.

The number average molecular weight of the polyolefin wax (b) is preferably 400 to 12,000, more preferably 500 to 5,000, and most preferably 600 to 2,000. If the molecular weight of the polyolefin wax (b) is too low, the thermoplastic resin (B2) is liable to bleed out more than needed from the thermoplastic resin composition for a reflective material, resulting in possibility of reduction in reflectance. On the other hand, if the molecular weight is too high, the insufficient reflectance improvement effect as well as the too high melt viscosity of a resin composition is obtained.

The number average molecular weight can be determined by GPC measurement under the following conditions.

Apparatus: Gel permeation chromatograph Alliance GPC2000 type (manufactured by Waters Corporation)
Solvent: o-dichlorobenzene
Column: TSKgel column (manufactured by Tosoh Corporation)×4
Flow rate: 1.0 ml/min
Sample: 0.15 mg/mL o-dichlorobenzene solution
Temperature: 140° C.

Calibration curve: Prepared by using a commercially available monodisperse standard polystyrene.

Molecular weight conversion: In terms of PE/general-purpose calibration method

Note that the following coefficients of the Mark-Houwink viscosity formula shown below can be used for the calculation of general-purpose calibration.

Coefficients of polystyrene (PS): KPS=$1.38 \times 10^{-4}$, aPS=0.70

Coefficients of polyethylene (PE): KPE=$5.06 \times 10^{-4}$, aPE=0.70

[Method for the Preparation of Thermoplastic Resin (B2)]

As described above, the thermoplastic resin (B2) is obtained by introducing a vinyl compound having an aromatic hydrocarbon structure into the polyolefin wax (b).

The polyolefin wax (b) is obtained, for example, by polymerizing a corresponding olefin at a low pressure or an intermediate pressure. Examples of the polymerization catalyst suitably used for polymerization include a transition metal-containing olefin polymerization catalyst including, as representative examples, a magnesium-supported titanium catalyst described in Japanese Patent Application Laid-Open Nos. 57-63310, 58-83006 and 3-706, Japanese Patent No. 3476793, Japanese Patent Application Laid-Open Nos. 4-218508 and 2003-105022, and the like, and a metallocene catalyst described in International Publication Nos. 01/53369 and 01/27124, Japanese Patent Application Laid-Open Nos. 3-193796 and 2-41303, and the like.

It can also be obtained by thermal decomposition or radical decomposition of a corresponding olefin polymer such as polyethylene and polypropylene by a conventional method.

Further, a method in which a mixture of the above olefin polymer and a polymer of an aromatic vinyl compound such as polystyrene is subjected to thermal decomposition or radical decomposition is also one of the suitable method as example for introducing an aromatic structure to the polyolefin wax (b), in addition to the above-described method in which the polyolefin wax (b) is allowed to react with a vinyl compound having an aromatic hydrocarbon structure in the presence of a radical generator such as nitrile and a peroxide. In the thermal decomposition reaction and the radical decomposition reaction, decomposition reaction is dominant, but recombination reaction is also expected to occur in combination. Therefore, if such a method is used, it is also possible to introduce an aromatic structure into a polyolefin skeleton.

[White Pigment (C)]

The white pigment (C) used in the present invention may be any white pigment which is used in combination with the polyester resin (A) and the like to whiten these resins to thereby improve the light reflective function thereof. And specific examples thereof include titanium oxide, zinc oxide, zinc sulfide, lead white, zinc sulfate, barium sulfate, calcium carbonate, and alumina. These white pigments may be used singly or in combination of two or more. These white pigments may also be used treated with a silane coupling agent or a titanium coupling agent or the like. For example, the white pigment may be surface-treated with a silane-based compound such as vinyltriethoxysilane, 2-aminopropyltriethoxysilane, and 2-glycidoxypropyltriethoxysilane.

The white pigment is particularly preferably titanium oxide. Optical characteristics such as reflectance and hiding properties are improved by using titanium oxide. The rutile type of titanium oxide is preferred. The particle size of titanium oxide is 0.1 to 0.5 μm, preferably 0.15 to 0.3 μm.

These white pigments preferably have a small aspect ratio, that is, a generally spherical shape for the purpose of obtaining uniform reflectance or the like.

[Inorganic Filler (D)]

As the inorganic filler (D) to be used in the present invention, a known inorganic filler can be used without limitation. Specifically, it is preferred to use various inorganic reinforcing materials of a shape with a high aspect ratio such as a fibrous, powdery, granular, tabular, needlelike, cloth-like, and mat-like shape. Specific examples include glass fibers, inorganic compounds having a carbonyl structure (such as the whisker of carbonate such as calcium carbonate), hydrotalcite, titanates such as potassium titanate, Wollastonite, and xonotlite.

Glass fibers (BG) and inorganic compounds (BW) having a carbonyl structure are preferred among others. These inorganic fillers may be treated with a known compound such as a silicone compound. In particular, the glass fibers treated with a silicone compound is one of the preferred embodiments.

The inorganic filler as described above has an average length in the range of 10 μm to 10 mm, preferably 10 μm to 5 mm, and an aspect ratio (average fiber length L/average fiber diameter D) in the range of 1 to 500, preferably 10 to 350. The use of an inorganic filler in such a range is preferred in terms of improvement in strength, reduction of a coefficient of linear expansion, and the like. Further, the inorganic filler may have an average length in the range of 10 to 100 μm, preferably 10 to 50 μm, and an aspect ratio (L (average length of fibers)/D (average outside diameter of fibers)) in the range of 1 to 100, preferably 5 to 70.

The inorganic filler (D) to be used in the present invention may be a combination of two or more inorganic fillers having different lengths and different aspect ratios.

Specific examples of the inorganic filler (D1) having a large length and aspect ratio include glass fibers, silicate such as Wollastonite (calcium silicate), and titanate such as a potassium titanate whisker. Among these, glass fibers are preferred.

The lower limit of the length of the inorganic filler (D1) having a large length and aspect ratio is preferably 15 μm, more preferably 30 μm, further preferably 50 μm. On the other hand, the upper limit of the length of the inorganic filler (D1) is preferably 10 mm, more preferably 8 mm, further preferably 6 mm, and most preferably 5 mm. In particular, in the case of glass fibers, the lower limit of the length is preferably 500 μm, more preferably 700 μm, and further preferably 1 mm.

The lower limit of the aspect ratio of the inorganic filler (D1) is preferably 20, more preferably 50, and further preferably 90. On the other hand, the upper limit of the aspect ratio of the inorganic filler (D1) is preferably 500, more preferably 400, and further preferably 350.

Preferred examples of the inorganic filler (D2) having a relatively smaller length and aspect ratio than those of the inorganic filler as described above include an inorganic filler (BW) having a carbonyl group, and specific examples thereof include a whisker of carbonates such as calcium carbonate.

The aspect ratio of the above inorganic filler having a carbonyl group is preferably 1 to 300, more preferably 5 to 200, and further preferably 10 to 150.

A combined use of these inorganic fillers improves the dispersibility of the inorganic fillers in a base polymer and the compatibility of the base polymer with the inorganic fillers, which not only improves heat resistance, mechanical strength, and the like, but can improve the dispersibility of a white pigment (C) to be described below.

[Other Additives]

In the present invention, the following additives may be added depending on applications as long as that the effect of the present invention is not impaired: antioxidants (such as phenols, amines, sulfur, and phosphorus antioxidants), heat-resistant stabilizers (such as lactone compounds, vitamin Es, hydroquinones, copper halides, and iodine compounds), light stabilizers (such as benzotriazoles, triazines, benzophenones, benzoates, hindered amines, and oxanilides), other polymers (such as polyolefins, ethylene-propylene copolymers, olefin copolymers such as an ethylene-1-butene copolymer, olefin copolymers such as a propylene-1-butene copolymer, polystyrene, polyamide, polycarbonate, polyacetal, polysulfone, polyphenylene oxide, fluororesins, silicone resins, and LCP), flame retardants (such as bromine-based, chlorine-based, phosphorus-based, antimony-based, and inorganic flame retardants), fluorescent brightening agents, plasticizers, thickeners, antistatic agents, release agents, pigments, crystal nucleating agents, and various known compounding agents.

These additives may be used in a ratio of preferably 0 to 10% by mass, more preferably 0 to 5% by mass, and further preferably 0 to 1% by mass relative to 100% by mass of the sum of the polyester resin (A) and the thermoplastic resin (B), but the ratio varies depending on the type of the additive components.

When the resin composition of the present invention is used in combination with other components, the selection of the additives may be important. For example, when a catalyst or the like is included in the other components to be used in combination, it is obvious that a use of an additive containing a component or an element acting as a catalyst poison is preferably avoided. Examples of the additives a use of which is preferably avoided include components containing phosphorus, sulfur and the like.

[Thermoplastic Resin Composition for Reflective Material]

The thermoplastic resin composition for a reflective material of the present invention can be produced by a known method: for example, a method in which the above components are mixed with a Henschel mixer, a V-blender, a ribbon blender, a tumbler blender or the like; or a method in which, after the mixing, the mixture is further melt kneaded with a single-screw extruder, a multi-screw extruder, a kneader, a Banbury mixer or the like, and then is granulated or ground.

The thermoplastic resin composition for a reflective material of the present invention preferably contains the polyester resin (A) in a proportion of 30 to 85% by mass, more preferably 30 to 80% by mass in the total amount (100% by mass) of the polyester resin (A), the thermoplastic resin (B), the white pigment (C) and the inorganic filler (D). When the content of the polyester resin (A) is in the above range, a thermoplastic resin composition for a reflective material excellent in heat resistance that can endure the reflow soldering step can be obtained without impairing the moldability.

The thermoplastic resin composition for a reflective material of the present invention preferably contains the thermoplastic resin (B) in a range of 0.1 to 15% by mass in the total amount (100% by mass) of the polyester resin (A), the thermoplastic resin (B), the white pigment (C) and the inorganic filler (D).

The thermoplastic resin composition for a reflective material of the present invention preferably contains the white pigment (C) in a range of 5 to 50% by mass in the total amount (100% by mass) of the polyester resin (A), the thermoplastic resin (B), the white pigment (C) and the inorganic filler (D). When the amount of the white pigment (C) is 5% by mass or more, sufficient light reflective properties such as reflectance can be obtained. Further, the amount is preferably 50% by mass or less because the moldability will not be impaired.

The thermoplastic resin composition for a reflective material of the present invention preferably contains the inorganic filler (D) in a range of 1 to 50% by mass, more preferably 10 to 50% by mass in the total amount (100% by mass) of the polyester resin (A), the thermoplastic resin (B), the white pigment (C) and the inorganic filler (D). When the amount of the inorganic filler (D) is equal to or greater than the above lower limit, a molded article will not be deformed during the injection molding and in the reflow soldering step. And also, a tendency that the temporal stability of reflectance becomes excellent is obtained. Further, when the amount of the inorganic filler (D) is equal to or less than the above upper limit, a molded article having good moldability and appearance can be obtained.

Specifically, the thermoplastic resin composition for a reflective material of Embodiment 1 of the present invention may contain the polyester resin (A) in a range of 30 to 80% by mass, preferably 30 to 70% by mass, and more preferably 40 to 60% by mass in 100% by mass of the total amount of the polyester resin (A), the thermoplastic resin (B1), the white pigment (C) and the inorganic filler (D).

In the thermoplastic resin composition for a reflective material of Embodiment 1 of the present invention, a content of the polyester resin (A) may be adjusted in a range of more than 30% by mass and 80% by mass or less, preferably more than 30% by mass and 70% by mass or less, and more preferably 40 to 60% by mass in 100% by mass of the total amount of the polyester resin (A), the white pigment (C) and the inorganic filler (D).

The thermoplastic resin composition for a reflective material of Embodiment 1 of the present invention preferably contains the thermoplastic resin (B1) in a range of 0.1 to 15% by mass, more preferably 0.5 to 15% by mass, and further preferably 1 to 12% by mass in the total amount (100% by mass) of the polyester resin (A), the thermoplastic resin (B1), the white pigment (C) and the inorganic filler (D).

When the amount of the thermoplastic resin (B1) is 0.1% by mass or more, there is a tendency that the temporal stability of high reflectance is easily developed, in addition to toughness and heat resistance. Further, when the amount of the thermoplastic resin (B1) is 15% by mass or less, high toughness can be imparted without impairing high heat resistance and temporal stability of reflectance.

Further, the thermoplastic resin composition for a reflective material of Embodiment 1 of the present invention may contain the white pigment (C) in a range of 5 to 50% by mass, preferably 10 to 50% by mass, and more preferably 10 to 40©% by mass in the total amount (100% by mass) of the polyester resin (A), the thermoplastic resin (B1), the white pigment (C), and the inorganic filler (D).

In the thermoplastic resin composition for a reflective material of Embodiment 1 of the present invention, a content of the white pigment (C) may be adjusted in a ratio of more than 5% by mass and 50% by mass or less, preferably 10 to 50% by mass, and more preferably 10 to 40% by mass relative to 100% by mass of the total amount of the polyester resin (A), the white pigment (C) and the inorganic filler (D).

Further, the thermoplastic resin composition for a reflective material of Embodiment 1 of the present invention may contain the inorganic filler (D) in a range of 1 to 50% by mass, preferably 5 to 40% by mass, and more preferably 15 to 35% by mass in the total amount (100% by mass) of the polyester resin (A), the thermoplastic resin (B1), the white pigment (C) and the inorganic filler (D).

In the thermoplastic resin composition for a reflective material of Embodiment 1 of the present invention, a content of the inorganic filler (D) may be adjusted in a range of more than 1% by mass and 50% by mass or less, preferably 5 to 40% by mass, and more preferably 15 to 35% by mass relative to 100% by mass of the total amount of the polyester resin (A), the white pigment (C) and the inorganic filler (D).

Further, the thermoplastic resin composition for a reflective material of Embodiment 2 of the present invention may contain the polyester resin (A) in a range of 30 to 85% by mass, preferably 35 to 80% by mass, more preferably 40 to 75% by mass, and further preferably 45 to 70% by mass in the total amount (100% by mass) of the polyester resin (A), the thermoplastic resin (B2), the white pigment (C) and the inorganic filler (D).

Further, the thermoplastic resin composition for a reflective material of Embodiment 2 of the present invention may contain the thermoplastic resin (B2) in a range of 0.1 to 10% by mass, preferably 0.5 to 5% by mass, and more preferably 1 to 4% by mass in the total amount (100% by mass) of the polyester resin (A), the thermoplastic resin (B2), the white pigment (C) and the inorganic filler (D).

When the amount of the thermoplastic resin (B2) is a certain value or more, there will be a tendency that the temporal stability of high reflectance as well as flowability can be easily developed. When the amount of the thermoplastic resin (B2) is a certain value or less, high heat resistance as well as temporal stability of reflectance will be hardly impaired.

Further, the thermoplastic resin composition for a reflective material of Embodiment 2 of the present invention may contain the white pigment (C) in a range of 5 to 50% by mass, preferably 10 to 50% by mass, more preferably 10 to 40% by mass, and further preferably 10 to 30% by mass in the total amount (100% by mass) of the polyester resin (A), the thermoplastic resin (B2), the white pigment (C) and the inorganic filler (D).

Further, the thermoplastic resin composition for a reflective material of Embodiment 2 of the present invention may contain the inorganic filler (D) in a range of 10 to 50% by mass, preferably 10 to 40% by mass, and more preferably 10 to 30% by mass in the total amount (100% by mass) of the polyester resin (A), the thermoplastic resin (B2), the white pigment (C) and the inorganic filler (D).

The thermoplastic resin composition for a reflective material of the present invention in the above composition ranges is excellent in mechanical properties, reflectance, and heat resistance, and can be suitably used for the reflective plate application.

Further, the thermoplastic resin composition for a reflective material of Embodiment 1 of the present invention contains a specific amount of the thermoplastic resin (B1). Therefore, the thermoplastic resin composition for a reflective material of Embodiment 1 of the present invention will probably provide a molded article having good moldability (melt-flowability) and high toughness without impairing high heat resistance and temporal stability of reflectance.

Further, since the thermoplastic resin composition for a reflective material of Embodiment 2 of the present invention has a specific amount of the thermoplastic resin (B2), it is possible to provide a material excellent in moldability and having a higher reflectance than before. Although this reason is not certain, it is estimated as follows.

It is known that a polymer having an aromatic hydrocarbon structure has high glossiness. Further, a polymer having a relatively low molecular weight will probably tend to be distributed concentrating on the surface of a resin composition. Since the thermoplastic resin (B2) has a relatively low molecular weight and has an aromatic hydrocarbon structure, it is estimated that the thermoplastic resin (B2) is easily distributed concentrating on the surface of the thermoplastic resin composition for a reflective material to improve the reflectance thereof. Further, since the aromatic hydrocarbon structure has a relatively good compatibility with a polar structure such as the ester structure of the polyester resin (A), it is estimated that the aromatic hydrocarbon structure is stable in the resin composition and leads to little temporal change of reflectance.

[Application]

The thermoplastic resin composition is suitable for various reflective plates and particularly suitable for a reflective plate which reflects the light from a light source such as a semiconductor laser and a light-emitting diode. Because the thermoplastic resin composition for a reflective material of the present invention is provided, a molded article of the resin composition having high mechanical strength, the resin composition being excellent in heat resistance being excellent in flowability and moldability, the molded article having high reflectance and showing little temporal decrease in reflectance.

2. Reflective Plate, Reflective Plate for Light-Emitting Diode Element

The reflective plate of the present invention may be obtained by molding the thermoplastic resin composition for a reflective material as described above into an arbitrary shape.

The reflective plate generally includes a casing and a housing in which a surface in the direction to emit light is at least open or not open. And more specifically, the reflective plate generally includes a three-dimensional molded body in general having a light-reflecting surface (a surface such as a flat surface, a spherical surface, and a curved surface), examples of the molded body including the one having a shape of a box or a case, the one having a shape of funnel, the one having a shape of bowl, the one having a shape of parabola, the one having a cylindrical shape, the one having a conical shape, and the one having a shape of honeycomb.

In particular, since the reflective plate obtained by using the resin composition of Embodiment 1 of the present invention is excellent in heat resistance, temporal stability of reflectance, and toughness, even a thin reflective plate will probably have high possibility of having sufficient strength. Therefore, the reflective plate is expected to contribute to the weight reduction and downsizing of an LED element or the like.

The application of the reflective plate of the present invention most preferably includes a reflective plate for a light-emitting diode element. The reflective plate for a light-emitting diode (LED) element of the present invention is obtained by shaping the thermoplastic resin composition for a reflective material as described above into a desired shape by hot forming such as injection molding, particularly insert molding of metal such as insert hoop molding, melt molding, extrusion molding, inflation molding, and blow molding. In addition, a light-emitting diode element can be obtained by mounting an LED element and other parts to the reflective plate, followed by sealing with a sealing resin, joining, bonding, and the like.

Further, the thermoplastic resin composition and reflective plate of the present invention can be adapted not only to the LED application but also to other applications for reflecting light. As specific examples, the reflective plate of the present invention can be used as a reflective plate for light-emitting apparatuses, such as various electric electronic components, interior illumination, ceiling illumination, exterior illumination, automobile illumination, display equipment, and headlights.

Examples

1. Thermoplastic Resin Composition for Reflective Material of Embodiment 1

[Melting Point (Tm)]

Using DSC7 manufactured by PerkinElemer Inc., the resin composition was temporarily held at 330° C. for 5 minutes, then cooled to 23° C. at a rate of 10° C./miry and then heated at a rate of 10° C./min. The endothermic peak based on the melting of the resin composition observed in this process was defined as a melting point.

[$^1$H NMR Measurement]

The $^1$H NMR measurement was performed using an ECX400-type nuclear magnetic resonance apparatus manufactured by JEOL Ltd. under the conditions of deuterated orthodichlorobenzene as a solvent, a sample concentration of 20 mg/0.6 mL, a measurement temperature of 120° C., an observation nucleus of $^1$H (400 MHz), a sequence of a single pulse, a pulse width of 5.12 μseconds (45° pulse), a repetition time of 7.0 seconds, and an integration count of 500 times or more. The reference chemical shift was defined by setting the peak derived from a residual hydrogen of deuterated orthodichlorobenzene at 7.10 ppm. A peak of $^1$H and the like derived from a functional group-containing compound was assigned by a conventional method.

[Density of Olefin Polymer]

A sheet having a thickness of 0.5 mm was molded at a pressure of 100 kg/cm$^2$ using a hydraulic hot press machine manufactured by SHINTO Metal Industries Corporation set at 190° C. using spacers (spacer shape: 9 pieces of sheets each having a size of 45×45×0.5 mm are produced from a plate having a size of 240×240×0.5 mm in thickness). A test sample was prepared by cooling the resulting sheet by compressing at a pressure of 100 kg/cm$^2$ using a different hydraulic hot press machine manufactured by SHINTO Metal Industries Corporation set at 20° C. A stainless steel plate having a thickness of 5 mm was used as a hot plate. The resulting pressed sheet was heat-treated at 120° C. for one hour, slowly cooled linearly to room temperature over one hour, and then subjected to measurement with a density gradient tube.

[Flexural Test]

A test piece of 64 mm in length, 6 mm in width, and 0.8 mm in thickness prepared under the following molding conditions using the following injection molding machine was allowed to stand at a temperature of 23° C. in a nitrogen atmosphere for 24 hours. Next, the resulting test piece was subjected to flexural test under the conditions of a span of 26 mm and a flexural rate of 5 mm/min using a flexural test machine AB5 manufactured by NTESCO in an atmosphere of a temperature of 23° C. and a relative humidity of 50% to measure a strength, an amount of deflection, an elastic modulus, and an energy (toughness) required for breaking the test piece.

Molding machine: Sodick Plustech Co., Ltd., Tuparl TR40S3A

Molding machine cylinder temperature: melting point (Tm)+10° C., mold temperature: 150° C.

[Initial Reflectance]

A resin composition was injection molded under the following molding conditions using the following molding machine to obtain a test piece of 30 mm in length, 30 mm in width, and 0.5 mm in thickness.

Molding machine: SE50DU manufactured by Sumitomo Heavy Industries, Ltd.

Cylinder temperature: melting point (Tm)+10° C., mold temperature: 150° C.

The obtained test piece was determined for the reflectance in the wavelength region from 360 nm to 740 nm using CM3500d manufactured by Minolta Co., Ltd. The initial reflectance was evaluated by using the reflectance at 450 nm and 550 nm as representative values.

[Reflectance After Heating]

The sample used for the measurement of initial reflectance was allowed to stand in an oven at 150° C. for 336 hours. This sample was measured for the reflectance in the same manner as in the initial reflectance, and the resulting reflectance was defined as the reflectance after heating.

[Flowability]

A bar-flow mold having a width of 10 mm and a thickness of 0.5 mm was used for injection molding under the following conditions to measure the flow length (mm) of a resin in the mold.

Injection molding machine: Sodick Plustech Co., Ltd., Tuparl TR40S3A

Injection set pressure: 2,000 kg/cm$^2$,

Cylinder set temperature: melting point (Tm)+10° C., and

Mold temperature: 30° C.

(Production Example of Polyester Resin)

To a mixture of 106.2 parts of dimethyl terephthalate and 94.6 parts of 1,4-cyclohexanedimethanol (cis/trans ratio: 30/70), was added 0.0037 part of tetrabutyl titanate, and the resulting mixture was heated from 150° C. to 300° C. over 3 and a half hours, so as to complete an ester exchange reaction.

At the completion of the ester exchange reaction, 0.066 part of magnesium acetate tetrahydrate dissolved in 1,4-cyclohexanedimethanol was added, and thereto was subsequently introduced 0.1027 part of tetrabutyl titanate to carry out polycondensation reaction.

In the polycondensation reaction, the pressure was gradually reduced from normal pressure to 1 Torr over 85 minutes; at the same time, the temperature was increased to a predetermined polymerization temperature of 300° C.; the temperature and the pressure were held; the reaction was completed when a predetermined stirring torque was reached; and a produced polymer was obtained. Further, the obtained polymer was subjected to solid state polymerization at 260° C. and 1 Torr or less for 3 hours. The obtained polymer (polyester resin (A1)) had a [η] of 0.6 dl/g and a melting point of 290° C.

(Preparation Example 1 of Ethylene-1-Butene Copolymer)

[Preparation of Catalyst Solution]

To a glass flask sufficiently replaced with nitrogen, was charged 0.63 mg of bis(1,3-dimethylcyclopentadienyl)zirconium dichloride, and thereto were further added 1.57 ml of a methylaluminoxane solution in toluene (Al: 0.13 mmol/liter) and 2.43 ml of toluene to thereby obtain a catalyst solution.

[Ethylene/1-Butene Copolymerization]

Into a stainless steel autoclave having an internal volume of 2 liters sufficiently replaced with nitrogen, were introduced 912 ml of hexane and 320 ml of 1-butene, and the temperature in the system was increased to 80° C. Subsequently, the polymerization was started by injecting 0.9 mmol of triisobutylaluminum and 2.0 ml (0.0005 mmol as Zr) of the catalyst solution prepared as described above with ethylene. The total pressure was maintained at 8.0 kg/cm$^2$-G by continuously supplying ethylene, and the polymerization was carried out at 80° C. for 30 minutes.

A small amount of ethanol was introduced into the system to quench the polymerization, and then unreacted ethylene was purged. The obtained solution was charged into a large excess of methanol to thereby precipitate a white solid. The white solid was obtained by filtration and dried under a reduced pressure overnight to obtain a white solid (ethylene-1-butene copolymer (B1-6)) having the following physical properties.

Density=0.862 g/cm$^3$

MFR (ASTM D1238 standard, 190° C., load 2,160 g)=0.5 g/10 min

1-Butene structural unit content: 4 mol %

(Preparation Example 2 of Ethylene-1-butene Copolymer)

An ethylene-1-butene copolymer (B1-5) having the following physical properties was obtained in the same manner as in Preparation Example 1 of an ethylene-1-butene copolymer except that the amount of 1-butene used was set to 290 ml. The results are shown also in Table 1.

Density=0.870 g/cm$^3$

MFR (ASTM D1238 standard, 190° C., load 2,160 g)=0.5 g/10 min (Modification Example 1 of Ethylene-1-Butene Copolymer)

With 100 parts by weight of the ethylene-1-butene copolymer (B1-6) obtained as described above, were mixed 1.0 part by weight of maleic acid anhydride and 0.04 part by weight of a peroxide [Perhexyne 25B, manufactured by NOF Corporation, trade name]. The obtained mixture was subjected to melt graft modification in a single-screw extruder set at 230° C. to thereby obtain a modified ethylene-1-butene copolymer (B1-1) having the following physical properties. The amount of graft modification with maleic acid anhydride was 0.97% by weight. Further, the intrinsic viscosity [η] measured in a decalin solution at 135° C. was 1.98 dl/g. The results are shown also in Table 1.

(Modification Example 2 of Ethylene-1-Butene Copolymer)

A modified ethylene-1-butene copolymer (B1-2) was obtained in the same manner as in Modification Example 1 except that the ethylene-1-butene copolymer (B1-5) was used instead of the ethylene-1-butene copolymer (B1-6). The results are shown in Table 1.

(Modification Example 3 of Ethylene-1-Butene Copolymer)

A modified ethylene-1-butene copolymer (B1-3) was obtained in the same manner as in Modification Example 1 except that the ethylene-1-butene copolymer (B1-5), 0.5 part by weight of maleic acid anhydride, and 0.02 part by weight of Perhexyne 25B were used instead of the ethylene-1-butene copolymer (B1-6). The results are shown in Table 1.

(Modification Example 4 of Ethylene-1-Butene Copolymer)

A modified ethylene-1-butene copolymer (B1-4) was obtained in the same manner as in Modification Example 1 except that 2.0 parts by weight of maleic acid anhydride and 0.08 part by weight of Perhexyne 25B were used. The results are shown in Table 1.

TABLE 1

| No. | Polymer before modification | | Maleic acid anhydride/ parts by weight | Perhexyne 25B/parts by weight | After modification | |
|---|---|---|---|---|---|---|
| | Density/ (kg/m$^3$) | MFR/ (g/10 min) | | | MAH unit content/ wt % | [η]/ (dl/g) |
| B1-1 | 862 | 0.5 | 1.0 | 0.04 | 0.97 | 1.98 |
| B1-2 | 870 | 0.5 | 1.0 | 0.04 | 0.98 | 2.0 |
| B1-3 | 870 | 0.5 | 0.5 | 0.02 | 0.48 | 2.1 |
| B1-4 | 862 | 0.5 | 2.0 | 0.08 | 1.91 | 1.84 |
| B1-5 | 870 | 0.5 | — | — | — | 2.1 |

MAH: Maleic acid anhydride

Example 1

The above polyester resin (A1), the following inorganic filler (D1, D2), the following white pigment (C), and the above thermoplastic resin (B1) (olefin polymer) were mixed using a tumbler blender at a proportion as shown in Table 2. The obtained mixture as a raw material was melt-kneaded in a twin-screw extruder TEX30α manufactured by Japan Steel Works, Ltd. at a cylinder temperature of 310° C. and then extruded into a strand shape. The strand was cooled in a water tank, drawn by a pelletizer, and cut to thereby obtain a composition in a pellet shape (that is, good compound properties were shown). The results of the evaluation of various physical properties of the obtained polyester resin compositions are also shown in Table 2.

Inorganic filler (D1): glass fiber: length: 3 mm, aspect ratio: 300 (ECS03-615, a product treated with a silane compound, manufactured by Central Glass Co., Ltd.)

Inorganic filler (D2): calcium carbonate whisker (length: 25 μm, aspect ratio: 33)

White pigment (C): titanium oxide (powder, average particle size: 0.21 μm)

Examples 2 to 5, Comparative Examples 1 to 3

Polyester resin compositions were prepared in the same manner as in Example 1 except that the conditions shown in Table 2 were used. The results are shown in Table 2.

Comparative Example 4

The same procedures as in Examples were carried out in the blending ratio shown in Table 2, but the compound properties in the twin-screw extruder were poor, and it was unable to obtain good pellets.

TABLE 2

| | | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Polyester resin (A) | A | 50 | 50 | 50 | 53 | 45 | 55 | 50 | 50 | 35 |
| Inorganic filler (D) | D1 | 20 | 20 | 20 | 20 | 20 | 20 | 20 | 20 | 20 |
| | D2 | 5 | 5 | 5 | 5 | 5 | 5 | 5 | 5 | 5 |
| White pigment (C) | C | 20 | 20 | 20 | 20 | 20 | 20 | 20 | 20 | 20 |
| Thermoplastic resin (B1) | B1-1 | 5 | | | | | | | | |
| | B1-2 | | 5 | | | | | | | |
| | B1-3 | | | 5 | 2 | 10 | | | | 20 |
| | B1-4 | | | | | | | 5 | | |
| | B1-5 | | | | | | | | 5 | |
| Thin-wall bending | Toughness/mJ | 20 | 20 | 23 | 22 | 19 | 15 | 13 | 14 | — |
| | Strength/Mpa | 106 | 116 | 119 | 128 | 95 | 124 | 89 | 95 | — |
| | Elastic modulus/Mpa | 6200 | 6690 | 6520 | 7370 | 5800 | 8890 | 6400 | 8180 | — |
| | Deflection/mm | 3.0 | 3.0 | 3.2 | 2.9 | 3.2 | 2.2 | 2.5 | 2.2 | — |
| Reflection properties | Initial 450 nm | 88 | 88 | 88 | 89 | 89 | 90 | 86 | 90 | — |
| | 550 nm | 90 | 90 | 90 | 91 | 91 | 92 | 89 | 92 | — |
| | After heating 450 nm | 83 | 82 | 83 | 82 | 84 | 83 | 78 | 83 | — |
| | 150° C., 336 h 550 nm | 88 | 88 | 88 | 87 | 90 | 88 | 86 | 89 | — |
| Flowability | 0.5 L/t Flow length | 31 | 33 | 31 | 33 | 34 | 30 | 30 | 34 | — |
| Compound properties | | ○ | ○ | ○ | ○ | ○ | ○ | ○ | ○ | x |

As described above, it is found that the resin composition of the present invention has better balance among mechanical strength typified by a flexural test, toughness, reflectance, and temporal retention of reflectance as compared with conventional constitutions. Accordingly, the resin composition is suitable, for example, as a material for a reflective plate. As a particularly preferred example, it is suggested that the resin composition be suitable as a material for an LED reflective plate for which high heat resistance and reflectance retention are required.

2. Thermoplastic Resin Composition for Reflective Material of Embodiment 2

[Intrinsic Viscosity [η] of Polyester Resin (A)]

The polyester resin in an amount of 0.5 g was dissolved in a mixed solvent of phenol and tetrachloroethane in a weight ratio of 50/50. The falling time of the sample solution was measured using an Ubbelohde viscometer under a condition of 25° C.±0.05° C., and the intrinsic viscosity was calculated from the following expression (2).

$$[\eta]=\eta SP/[C(1+0.205\eta SP)] \quad (2)$$

[η]: intrinsic viscosity (dl/g)
ηSP: specific viscosity
C: sample concentration (g/dl)
t: falling time (seconds) of sample solution
t0: falling time (seconds) of blank sulfate
ηSP=(t−t0)/t0

[Measuring Method of Intrinsic Viscosity [η] of Thermoplastic Resin (B2)]

The intrinsic viscosity was measured at 135° C. using a decalin solvent. About 20 mg of a sample was dissolved in 15 ml of decalin, and the resulting solution was measured for specific viscosity ηSP in an oil bath at 135° C. To the decalin solution, was additionally added 5 ml of a decalin solvent to dilute the solution, and then the resulting decalin solution was measured for specific viscosity ηSP in the same manner. This dilution operation was further repeated twice, and the value of ηSP/C when the concentration (C) was extrapolated to 0 was determined as the intrinsic viscosity.

$$[\eta]=\lim(\eta SP/C)(C \to 0 [\text{molecular weight}])$$

[Measuring Method of Melt Viscosity at 140° C. of Thermoplastic Resin (B2)]

The melt viscosity was measured at 140° C. using a Brookfield viscometer.

[Melting Point (Tm)]

About 10 mg of a resin sample was weighed in a container for measurement, and the measurement was carried out based on a conventional method. Specifically, using DSC7 manufactured by PerkinElmer Inc., the sample was temporarily held at 330° C. for 5 minutes, then cooled to 23° C. at a rate of 10° C./min, and then heated at a rate of 10° C./min. The endothermic peak based on the melting of the sample observed in this process was defined as a melting point.

[Flexural Test (Toughness)]

A test piece of 64 mm in length, 6 mm in width, and 0.8 mm in thickness prepared under the following molding conditions using the following injection molding machine was allowed to stand at a temperature of 23° C. in a nitrogen atmosphere for 24 hours. Next, the resulting test piece was subjected to flexural test under the conditions of a span of 26 mm and a flexural rate of 5 mm/min using a flexural test machine AB5 manufactured by NTESCO in an atmosphere of a temperature of 23° C. and a relative humidity of 50% to measure flexural strength, the amount of deformation, elastic modulus, and energy (toughness) required for breaking the test piece.

Molding machine: Sodick Plustech Co., Ltd., Tuparl TR40S3A

Molding machine cylinder temperature: melting point (Tm)+10° C., mold temperature: 120° C.

[Flowability]

A bar-flow mold having a width of 10 mm and a thickness of 0.5 mm was used for injection molding under the following conditions to measure the flow length (mm) of a resin in the mold.

Injection molding machine: Sodick Plustech Co., Ltd., Tuparl TR40S3A

Injection set pressure: 2,000 kg/cm$^2$

Cylinder set temperature: melting point (Tm)+10° C.

Mold temperature: 30° C.

[Reflow Heat Resistance]

A test piece of 64 mm in length, 6 mm in width, and 0.8 mm in thickness prepared under the following molding conditions using the following injection molding machine was allowed to stand under humidity-condition at a temperature of 40° C. and a relative humidity of 95% for 96 hours.

Molding machine: Sodick Plustech Co., Ltd., Tuparl TR40S3A

Molding machine cylinder temperature: melting point (Tm)+10° C., mold temperature: 120° C.

Figure 1:
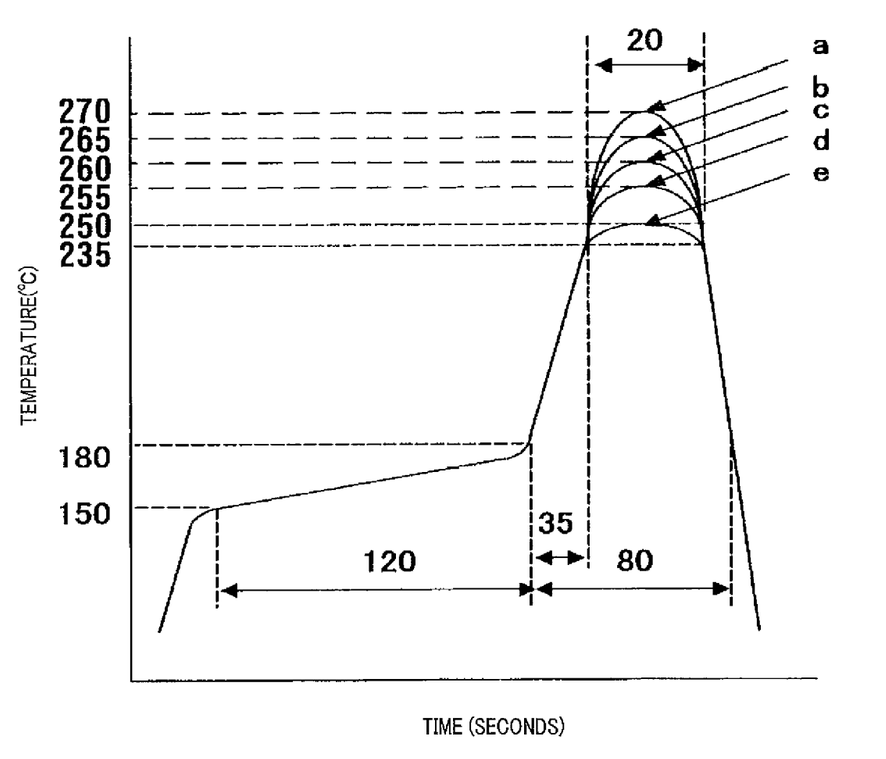
FIG. 1 illustrates the temperature profile of the reflow step for evaluating the reflow heat resistance in Examples.

The resulting test piece was subjected to reflow step according to a temperature profile shown in FIG. 1 using an air reflow soldering apparatus (AIS-20-82-C manufactured by Eightech Tectron Co., Ltd.).

The above humidity-conditioned test piece was placed on a glass epoxy substrate having a thickness of 1 mm, and a temperature sensor was installed on the substrate to measure a temperature profile. In FIG. 1, the temperature of the test piece was raised to 230° C. at a predetermined rate. Next, the temperature of the test piece was raised to a preset temperature (a: 270° C., b: 265° C., c: 260° C., d: 255° C., e: 250° C.) over 20 seconds by heating, and then the temperature was lowered to 230° C. The maximum value of the preset temperatures at which the test piece is not melted and no blister occurs on the surface of the test piece was determined, and this maximum value of the preset temperatures was defined as a reflow heat-resistant temperature. The results of Examples and Comparative Examples are shown in Table 3.

Generally, the reflow heat-resistant temperature of a test piece that has absorbed moisture tends to be low as compared with that of a test piece in an absolute dry state.

[Initial Reflectance]

A resin composition was injection molded under the following molding conditions using the following molding machine to obtain a test piece of 30 mm in length, 30 mm in width, and 0.5 mm in thickness.

Molding machine: Sodick Plustech Co., Ltd., Tuparl TR40S3A

Cylinder temperature: melting point (Tm)+10° C., mold temperature: 120° C.

The obtained test piece was determined for the reflectance in the wavelength region from 360 nm to 740 nm using CM3500d manufactured by Minolta Co., Ltd. The initial reflectance was evaluated by using the reflectance at 470 nm and 550 nm as representative values.

[Reflectance After Heating]

The sample used for the measurement of initial reflectance was allowed to stand in an oven at 170° C. for 2 hours. Subsequently, the sample was subjected to a similar thermal treatment to that of a reflow process using an air reflow soldering apparatus (AIS-20-82-C manufactured by Eightech Tectron Co., Ltd.) The preset temperature is held for 20 seconds and the peak temperature was higher than the preset temperature by 10° C. The peak temperature was set so as to be 260° C. at the surface of the sample.

This sample was slowly cooled and then measured for the reflectance in the same manner as in the initial reflectance, and the resulting reflectance was defined as the reflectance after heating.

Example 6

The polyester resin (A), the thermoplastic resin (B2) (low molecular weight thermoplastic resin), the white pigment (C), and the inorganic filler (D) were mixed using a tumbler blender in a proportion as shown in Table 3. The obtained mixture was melt-kneaded in a twin-screw extruder TEX30α manufactured by Japan Steel Works, Ltd. at a cylinder temperature of 300° C. and then extruded into a strand shape. The strand was cooled in water in a tank, drawn by a pelletizer, and cut to thereby obtain a composition in a pellet shape. The results of the evaluation of various physical properties of the obtained resin compositions are shown in Table 3.

Polyester Resin (A)

Composition: dicarboxylic acid component unit (terephthalic acid: 100 mol %), diol component unit (cyclohexanedimethanol: 100 mol %)

Intrinsic viscosity [η]: 0.6 dl/g

Melting point: 290° C.

Thermoplastic Resin (B2) (Low Molecular Weight Thermoplastic Resin)

A mixture of an ethylene polymer-based wax obtained with a known solid titanium catalyst component and styrene was allowed to react with each other in the presence of a known radical generator to obtain the following thermoplastic resin (B2).

Viscosity measured at 135° C. in decalin: 0.10 dl/g

Melt viscosity at 140° C.: 1,100 mPa·s

Styrene unit content: 60% by mass

White pigment (C): titanium oxide (powder, average particle size: 0.21 μm)

Inorganic filler (D): calcium carbonate whisker (length: 25 μm, aspect ratio: 33)

Comparative Example 5

Comparative Example 5 was carried out in the same manner as in Example 6 except that the content of the polyester resin (A) was changed without adding the thermoplastic resin (B2).

TABLE 3

|  |  | Example 6 | Comparative Example 5 |
|---|---|---|---|
| Polyester resin (A) | % by mass | 60 | 63 |
| Thermoplastic resin (B2) | % by mass | 3 | — |
| Inorganic filler (D) | % by mass | 17 | 17 |
| White pigment (C) | % by mass | 20 | 20 |
| Initial  470 nm | % | 89.0 | 88.4 |
| reflectance 550 nm | % | 90.4 | 90.0 |
| Reflectance 470 nm | % | 86.3 | 85.8 |
| after heating 550 nm | % | 88.6 | 88.0 |
| Flexural test (toughness) | mJ | 20 | 20 |
| Flowability | mm | 38 | 33 |
| Reflow heat resistance | ° C. | 275 | 270 |

As described above, the resin composition of the present invention is excellent in the balance of mechanical strength, heat resistance, flowability, and reflectance of a molded article as compared with before. In particular, high reflectance can be stably obtained. The resin composition of the present invention can probably provide a reflective plate which shows little decrease in reflectance due to heating, for example, in the steps of producing LED and reflow soldering. Therefore, the resin composition is suitable, for example, as a material for a reflective plate. As a particularly preferred example, it is suggested that the resin composition be suitable as a material for an LED reflective plate in which high heat resistance and reflectance retention are required.

It is estimated that the resin composition of the present invention shows such high performance balance because of good dispersibility and compatibility between the specific thermoplastic resin (B2) having a low molecular weight and the highly heat-resistant resin (A) which are used in the present invention, as described above.

The present application claims the priority based on Japanese Patent Application No. 2011-168455 filed on Aug. 1, 2011 and Japanese Patent Application No. 2012-087983 filed on Apr. 6, 2012. All the contents described in the application specification and drawings are incorporated herein by reference.

The invention claimed is:

1. A thermoplastic resin composition for a reflective material comprising:
    30 to 85% by mass of a polyester resin (A) having a melting point or glass transition temperature of 250° C. or more;
    0.1 to 15% by mass of a thermoplastic resin (B) having a polyolefin skeleton and a functional group;
    5 to 50% by mass of a white pigment (C); and
    1 to 50% by mass of an inorganic filler (D), wherein the total of (A), (B), (C) and (D) is 100% by mass,
    the thermoplastic resin (B) being
        a thermoplastic resin (B1) containing a polyolefin skeleton and 0.1 to 1.8% by weight of a functional group containing a hetero atom, or
        a thermoplastic resin (B2) containing a polyolefin skeleton and an aromatic hydrocarbon structure, and having an intrinsic viscosity as measured at 135° C. in decalin of 0.04 to 1.0 dl/g.

2. The thermoplastic resin composition for a reflective material according to claim 1, wherein the polyester resin (A) contains an alicyclic hydrocarbon structure, and a content of the inorganic filler (D) is 10 to 50% by mass.

3. The thermoplastic resin composition for a reflective material according to claim 1, wherein a content of the polyester resin (A) is 30 to 80% by mass.

4. The thermoplastic resin composition for a reflective material according to claim 1, wherein
    the thermoplastic resin (B) is the thermoplastic resin (B1), and
    the polyester resin (A) is a polyester resin (A1) containing:
        a dicarboxylic acid component unit (a-1) comprising 30 to 100 mol % of a dicarboxylic acid component unit derived from terephthalic acid, 0 to 70 mol % of an aromatic dicarboxylic acid component unit other than terephthalic acid, and/or 0 to 70 mol % of a $C_{4-20}$ aliphatic dicarboxylic acid component unit; and
        a $C_{4-20}$ alicyclic dialcohol component unit (a-2) and/or a $C_{4-20}$ aliphatic dialcohol component unit (a-3).

5. The thermoplastic resin composition for a reflective material according to claim 4, wherein the alicyclic dialcohol component unit (a-2) contained in the polyester resin (A1) has a cyclohexane skeleton.

6. The thermoplastic resin composition for a reflective material according to claim 4, wherein the inorganic filler (D) comprises an inorganic filler containing a carbonyl structure and having an aspect ratio of 1 to 300.

7. The thermoplastic resin composition for a reflective material according to claim 4, wherein the inorganic filler (D) comprises two or more inorganic fillers having different average lengths and aspect ratios.

8. The thermoplastic resin composition for a reflective material according to claim 6, wherein the inorganic filler (D) is a calcium carbonate whisker.

9. The thermoplastic resin composition for a reflective material according to claim 4, wherein the thermoplastic resin (B1) contains a functional group selected from carboxylic acid, ester, ether, aldehyde, and ketone.

10. The thermoplastic resin composition for a reflective material according to claim 9, wherein the thermoplastic resin (B1) contains a maleic acid anhydride structural unit.

11. The thermoplastic resin composition for a reflective material according to claim 1, wherein
    the thermoplastic resin (B) is the thermoplastic resin (B2), and
    the polyester resin (A) is a polyester resin (A2) containing:
        a dicarboxylic acid component unit (a-1) comprising 30 to 100 mol % of a dicarboxylic acid component unit derived from terephthalic acid, 0 to 70 mol % of an aromatic dicarboxylic acid component unit other than terephthalic acid, and/or 0 to 70 mol % of a $C_{4-20}$ aliphatic dicarboxylic acid component unit; and
        a $C_{4-20}$ alicyclic dialcohol component unit (a-2).

12. The thermoplastic resin composition for a reflective material according to claim 11, wherein the alicyclic dialcohol component unit (a-2) contained in the polyester resin (A2) has a cyclohexane skeleton.

13. The thermoplastic resin composition for a reflective material according to claim 11, wherein the white pigment (C) is titanium oxide.

14. A reflective plate comprising the thermoplastic resin composition for a reflective material according to claim 1.

15. The reflective plate according to claim 14, wherein the reflective plate is for a light-emitting diode element.

16. A light-emitting diode element comprising the thermoplastic resin composition for a reflective material according to claim 1.

* * * * *